(12) United States Patent
Yu et al.

(10) Patent No.: US 12,376,233 B2
(45) Date of Patent: Jul. 29, 2025

(54) CIRCUIT BOARD ASSEMBLY AND RADIO UNIT COMPRISING THE SAME

(71) Applicant: Telefonaktiebolaget LM Ericsson (publ), Stockholm (SE)

(72) Inventors: Donghai Yu, Beijing (CN); Pinghua Duan, Nanjing (CN); Qinqin Lu, Nanjing (CN); Peng Liu, Beijing (CN); Yunxuan Ma, Beijing (CN); Gongao Xu, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 188 days.

(21) Appl. No.: 18/261,294

(22) PCT Filed: Apr. 11, 2021

(86) PCT No.: PCT/CN2021/086341
§ 371 (c)(1),
(2) Date: Jul. 13, 2023

(87) PCT Pub. No.: WO2022/217387
PCT Pub. Date: Oct. 20, 2022

(65) Prior Publication Data
US 2024/0080981 A1    Mar. 7, 2024

(51) Int. Cl.
*H05K 1/14* (2006.01)
*H05K 1/18* (2006.01)

(52) U.S. Cl.
CPC ............ *H05K 1/141* (2013.01); *H05K 1/181* (2013.01); *H05K 2201/045* (2013.01); *H05K 2201/10984* (2013.01)

(58) Field of Classification Search
CPC ...... H05K 1/141; H05K 1/181; H05K 1/0203; H05K 2201/045; H05K 2201/10984
See application file for complete search history.

(56) References Cited

U.S. PATENT DOCUMENTS

| 5,438,479 A | 8/1995 | Heilbronner |
| 5,838,551 A | 11/1998 | Chan |

(Continued)

FOREIGN PATENT DOCUMENTS

| CN | 101052268 A | 10/2007 |
| CN | 101415297 B | 7/2010 |

(Continued)

*Primary Examiner* — Paresh Paghadal
(74) *Attorney, Agent, or Firm* — Murphy, Bilak & Homiller, PLLC

(57) ABSTRACT

A circuit board assembly (1), comprising a first circuit board (10) and a second circuit board (20) which are electrically connected with each other, and a monolithic substrate (30) configured for supporting a power component and comprising a first contact surface (31) that is fixedly connected to and forms a thermal contact with the second circuit board (20), the circuit board assembly being characterized in that, the substrate (30) further comprises a second contact surface (32) that is fixedly connected to the first circuit board (10) and forms a thermal contact with the first circuit board (10) so that the substrate functions as an extension of the first circuit board to support the second circuit board. A radio unit comprising a circuit board assembly (1) is also disclosed.

18 Claims, 3 Drawing Sheets

(56) References Cited

U.S. PATENT DOCUMENTS

| | | | |
|---|---|---|---|
| 6,083,022 A | 7/2000 | Walkup | |
| 2003/0142712 A1* | 7/2003 | Ikeda | H01S 5/02415 |
| | | | 372/36 |
| 2012/0243185 A1 | 9/2012 | Luo et al. | |
| 2018/0351595 A1 | 12/2018 | Tarui et al. | |
| 2023/0069267 A1* | 3/2023 | Rockstein | H05K 7/2039 |

FOREIGN PATENT DOCUMENTS

| | | |
|---|---|---|
| CN | 105682345 A | 6/2016 |
| CN | 105917749 A | 8/2016 |
| CN | 107734858 A | 2/2018 |
| CN | 109075132 A | 12/2018 |
| CN | 110099509 A | 8/2019 |

* cited by examiner

CIRCUIT BOARD ASSEMBLY AND RADIO UNIT COMPRISING THE SAME

TECHNICAL FIELD

The present disclosure generally relates to the technical field of circuit board, and more particularly, to a circuit board assembly and a radio unit comprising the same.

BACKGROUND

This section introduces aspects that may facilitate better understanding of the present disclosure. Accordingly, the statements of this section are to be read in this light and are not to be understood as admissions about what is in the prior art or what is not in the prior art.

Circuit boards, such as printed circuit boards (PCBs), are in wide use with various electronic products. A conventional circuit board is configured for use in laying out various electronic components, such as resistors, inductors, capacitors, diodes, transistors, or IC chips, and enabling electrical connection between the electronic components through a circuit layout thereon.

A unit or chip-type component that comprises a plurality of electronic components generates high heat when operating is known as a power component. For this power component, a special high-frequency and high-power circuit printed boards are needed. In order to simplify the design of the circuit printed board in the prior art, the printed board for mounting the power component thereon is generally modularized as a printed board module. And the printed board module can be directly mounted or connected as a daughterboard onto a conventional motherboard so as to expand the function of the motherboard and improve the integration degree of the whole circuit design.

As shown in FIG. 6, the daughterboard 20' with a power component 40' is entirely mounted on the motherboard 10'. A substrate 30' made of metal is placed below the power component and in thermal contact with the power component 40' so as to dissipate heat generated by the power component by means of providing more surfaces exposed to the environment.

In existing technology, as shown in FIG. 6, the daughterboard is mounted on the motherboard, with the bottom of the daughterboard resting fully against the upper side of the motherboard, and the part (about one third or even half) of the motherboard that is covered by the daughterboard could only function to support the daughterboard as a simple supporting base, without serving any substantial function in terms of circuit layout. This may cause a lot of waste, especially when the motherboard is an expensive multi-layered board.

Therefore, the present disclosure aims to overcome one or more of the above-mentioned problems in the prior art.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

One of the objects of the disclosure is to provide a circuit board assembly which allows higher integration degree of circuit boards with reduced cost and improved heat dissipation performance.

According to a first aspect of the disclosure, there is provided a circuit board assembly, comprising a first circuit board and a second circuit board which are electrically connected with each other, and a monolithic substrate configured for supporting a power component and comprising a first contact surface that is fixedly connected to and forms a thermal contact with the second circuit board. The substrate further comprises a second contact surface that is fixedly connected to the first circuit board and forms a thermal contact with the first circuit board so that the substrate functions as an extension of the first circuit board to support the second circuit board.

In an embodiment of the disclosure, the first circuit board is a mother circuit board, and the second circuit board is a daughter circuit board.

In an embodiment of the disclosure, the first circuit board and the second circuit board extend substantially in parallel and partially overlap with each other.

In an embodiment of the disclosure, the second circuit board extends above the first circuit board.

In an embodiment of the disclosure, the first contact surface of the substrate is fixedly connected to a lower side of the second circuit board.

In an embodiment of the disclosure, an area of the second circuit board that is in surface connection with the first contact surface is larger than an overlapping area associated with the first circuit board.

In an embodiment of the disclosure, the second contact surface of the substrate is fixedly connected to a lower side of the first circuit board.

In an embodiment of the disclosure, the second contact surface of the substrate is fixedly connected to an end side of the first circuit board.

In an embodiment of the disclosure, the second contact surface of the substrate comprises a connection reinforcing structure, and the first circuit board is provided with a complementary structure for cooperating with the connection reinforcing structure so as to reinforce the connection between the substrate and the first circuit board.

In an embodiment of the disclosure, the second contact surface of the substrate is fixedly connected to the first circuit board in a region close to an overlapping area between the first circuit board and the second circuit board.

In an embodiment of the disclosure, the second circuit board has a power component mounted thereon, and the power component is electrically connected to the upper side of the second circuit board, extending through an opening provided in the second circuit board and having its bottom fixedly connected with the substrate by soldering.

In an embodiment of the disclosure, the substrate comprises at least one positioning protrusion protruding from its second contact surface towards the first circuit board for positioning the substrate with respect to the first circuit board.

In an embodiment of the disclosure, the first circuit board is provided with at least one positioning hole for receiving the at least one positioning protrusion, preferably the positioning hole being a through-hole.

In an embodiment of the disclosure, an outer circumferential surface of the at least one positioning protrusion and an inner wall of the matching positioning hole are fixedly connected to each other by soldering.

In an embodiment of the disclosure, the first contact surface of the substrate is fixedly connected to the second circuit board by soldering, and/or the second contact surface of the substrate is fixedly connected to the first circuit board by soldering.

In an embodiment of the disclosure, the first circuit board and the second circuit board are provided with signal pads in an overlapping area therebetween, and are electrically connected with each other by soldering signal pads together.

In an embodiment of the disclosure, the electrical connection between the first circuit board and the second circuit board is achieved by means of a connector.

According to a second aspect of the disclosure, there is provided a radio unit comprising a circuit board assembly as stated in the above.

The circuit board assembly according to the present disclosure makes it possible to save materials for motherboard and thus reduce the cost for manufacturing. Additionally, the present disclosure allows making use of the daughterboard as a modular device and thus obtaining high flexibility in the arrangement of the daughterboards, higher integration degree, enhanced heat dissipation performance and better quality in both electrical connection and mechanical connection.

BRIEF DESCRIPTION OF THE DRAWINGS

These and other objects, features and advantages of the disclosure will become apparent from the following detailed description of illustrative embodiments thereof, which are to be read in connection with the accompanying drawings.

DETAILED DESCRIPTION

The embodiments of the present disclosure are described in detail with reference to the accompanying drawings. It should be understood that these embodiments are discussed only for the purpose of enabling those skilled in the art to better understand and thus implement the present disclosure, rather than suggesting any limitations on the scope of the present disclosure. Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Furthermore, the described features, advantages, and characteristics of the disclosure may be combined in any suitable manner in one or more embodiments. Those skilled in the relevant art will recognize that the disclosure may be practiced without one or more of the specific features or advantages of a particular embodiment. In other instances, additional features and advantages may be recognized in certain embodiments that may not be present in all embodiments of the disclosure.

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

Figure 1:
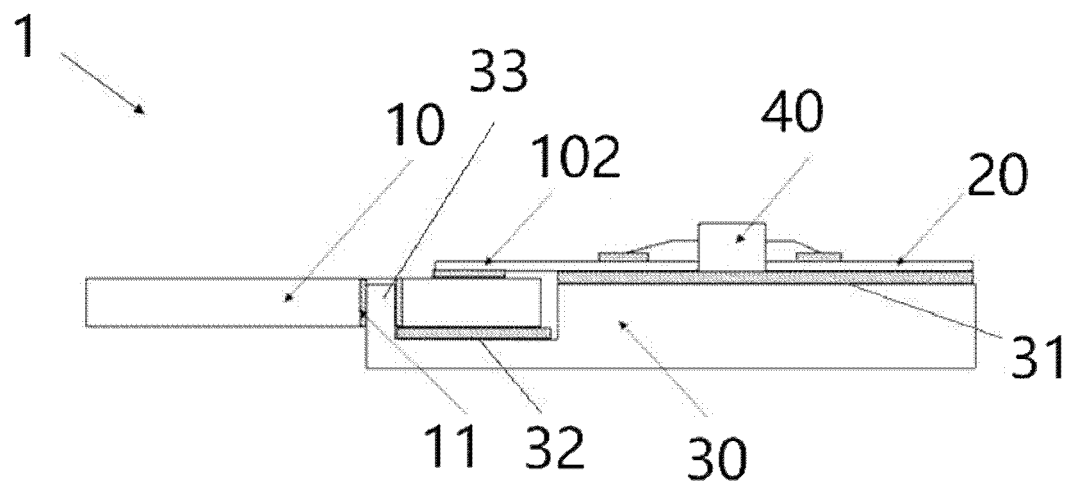
FIG. 1 shows a cross-sectional view of a circuit board assembly according to a first embodiment of the present disclosure.

FIG. 1 shows a side view of a circuit board assembly 1 according to a first embodiment of the present disclosure, wherein the circuit board assembly 1 includes a first circuit board 10 and a second circuit board 20 which are electrically connected with each other. In the embodiment shown, the first circuit board 10 and the second circuit board 20 extend approximately in parallel and partially overlap with each other, with the second circuit board 20 extending above the first circuit board 10. In the overlapping area 102, the first circuit board 10 and the second circuit board 20 are respectively provided with signal pads which are joined together by melting the solder applied therebetween, so that the electrical connection between the first circuit board 10 and the second circuit board 20 can be achieved. Of course, it will be appreciated that the first circuit board 10 and the second circuit board 20 can be electrically connected using other means, for example, through a connector, etc.

Hereinbelow, "partially overlap" means that the first circuit board 10 and second circuit board 20 each have a body portion that is not within the overlapping area 102.

The second circuit board 20 is provided thereon with a power component 40, such as a power amplifier. A substrate 30 is connected to the power component, so as to carry or support the power component 40 and cool the power component by transferring heat generated by the power component to the environment around the substrate. The surface of the substrate exposed to the environment can increase the area for heat dissipation and thus help to remove heat from the power component 40. The bottom part of the power component 40 extends through an opening arranged in the second circuit board 20 and comes into thermal contact with the substrate 30, which allows forming a thermal conduction path from the power component 40 to the substrate 30. The pins of the power component 40 are soldered on the upper side of the second circuit board 20 so as to achieve the electrical connection between the power component 40 and the second circuit board 20. The bottom of the power component 40 is fixedly connected with the substrate 30 by melting the solder applied therebetween. According to the present disclosure, the substrate 30 is made of a material with high electrical conductivity and thermal conductivity. Typically, the substrate is made of metal, and formed as one-piece component. One illustrating example of the substrate 30 may be a flat and tabular metal block, sometimes referred to as a "coin".

As shown in FIG. 1, the substrate 30 has a first contact surface 32 which forms a thermal contact with the second circuit board 20 on the lower side of the second circuit board. The first contact surface 31 is fixedly connected with the second circuit board 20 so that the second circuit board 20 and the power component 40 mounted thereon can be well supported. The fixed connection between the first contact surface 31 and the second circuit board 20 can be realized, for example, by a soldering joint applied therebetween or by adhesive bonding technique. The adhesive used here can be thermally and electrically conductive.

It can be seen from FIG. 1 that an area of the lower side of the second circuit board 20 that is in surface connection with the first contact surface 31 is larger than the area of the second circuit board 20 that is covered by the first circuit board 10. In this way, the substrate 30 functions as a main support for the second circuit board 20. Or rather, the second circuit board 20 rests against the first contact surface 31 of the substrate. Without such a substrate, the second circuit board 20 may turn into a "suspended" state and may easily fall off because the connection in the overlapping area is not strong enough to keep the second circuit board suspending all the time. While, by placing the substrate 30 underneath the second circuit board 20 to take place of a portion of the first circuit board, the first circuit board 10 can be shortened as much as possible, or only a small part of the first circuit board is used for the second circuit board, which therefore enables expanding the space available for the mounting of other circuit boards, and further improves the flexibility of mounting circuit boards.

As show in FIG. 1, the substrate 30 also has a second contact surface 32. The second contact surface 32 forms a thermal contact with the lower side of the first circuit board 10, and is fixedly connected with the first circuit board 10. Therefore, the mechanical connection between the substrate 30 and the first circuit board 10 enables the substrate 30 to serve as an extension of the first circuit board to support the second circuit board. With this configuration, a part of the first circuit board that is now replaced by the substrate can be then omitted and thus saved, which therefore has an advantage of reducing the manufacturing cost, especially when the first circuit board is expensive to be manufactured. The fixed connection between the second contact surface 32 and the first circuit board 10 can be realized, for example, by a soldering joint applied therebetween or by bonding with the aid of an adhesive conducting heat and electricity.

As shown in FIG. 1, the substrate 30 can also function to support the first circuit board 10, in cases where the substrate 30 is reasonably designed and properly positioned.

In the preferred embodiment shown in FIG. 1, the second contact surface 32 extends in a region below or adjacent to the overlapping area 102 between the first circuit board and the second circuit board, so that a heat transfer path from the overlapping area to the second contact surface 32 of the substrate 30 can be made as short as possible.

The substrate 30 is provided with a plurality of positioning protrusions 33 protruding from the second contact surface 32. These positioning protrusions 33 can be used to position the substrate 30 relative to the first circuit board 10 and thus allow wide error tolerance for assembling. In the preferred embodiment shown in FIG. 1, the first circuit board 10 is provided with positioning holes 11 for receiving the positioning protrusions 33. Preferably, the positioning holes 11 are through holes penetrating from the upper side to the lower side of the first circuit board 10. From the top view shown in FIG. 2, it can be seen that the positioning protrusions 33 extend into the positioning holes 11 respectively. Preferably, the outer circumferential surface of the positioning protrusions 33 and the inner wall of the matching positioning holes 11 are fixed together by a soldering joint. Alternatively, the positioning protrusions 33 and the positioning holes 11 can be joined by an adhesive bonding.

Figure 3:
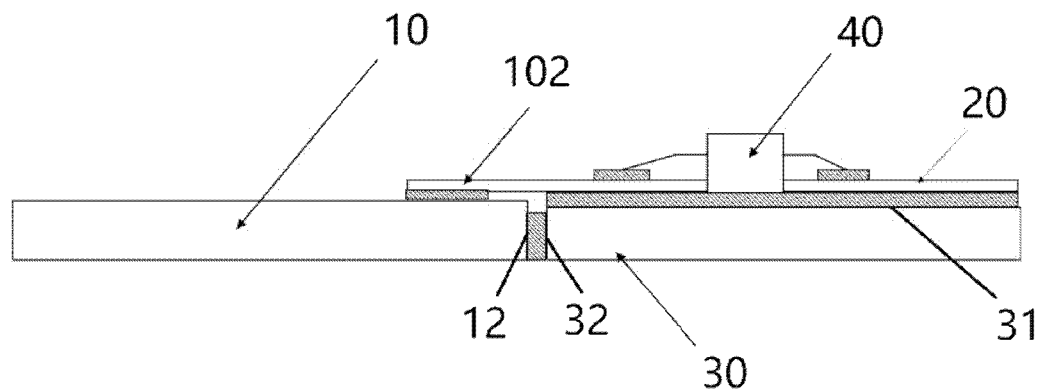
FIG. 3 shows a cross-sectional view of a circuit board assembly according to a second embodiment of the present disclosure.

According to the second embodiment of the present disclosure shown in FIG. 3, the second contact surface 32 of the substrate 30 may include an end side face of the substrate facing the end surface 12 of the first circuit board 10. As shown in FIG. 3, a solder joint is applied between the end surface 12 of the first circuit board 10 and the second contact surface 32 of the substrate 30. Alternatively, a thermally and electrically conductive adhesive can be applied therebetween for bonding. The thermal contact between the end surface 12 of the first circuit board 10 and the second contact surface 32 of the substrate 30 is also created near the overlapping area 102, and thus a short path for transferring heat is formed. Thereby, heat generated by the electrical connection between the two circuit boards is efficiently transferred to the substrate 30 for heat dissipation.

Figure 4:
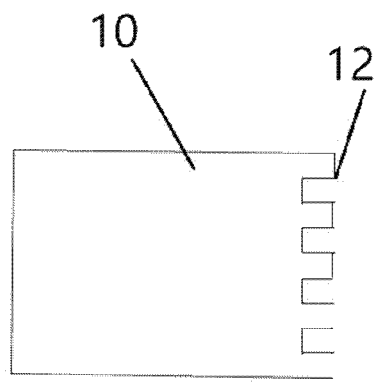
FIG. 4 shows a side view of one structured end surface of the first circuit board for the second embodiment of the present disclosure.
Figure 5:
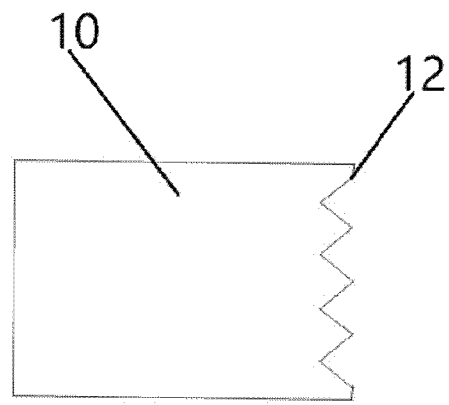
FIG. 5 shows a side view of a variant of the structured end surface of the first circuit board for the second embodiment of the present disclosure.
Figure 6:
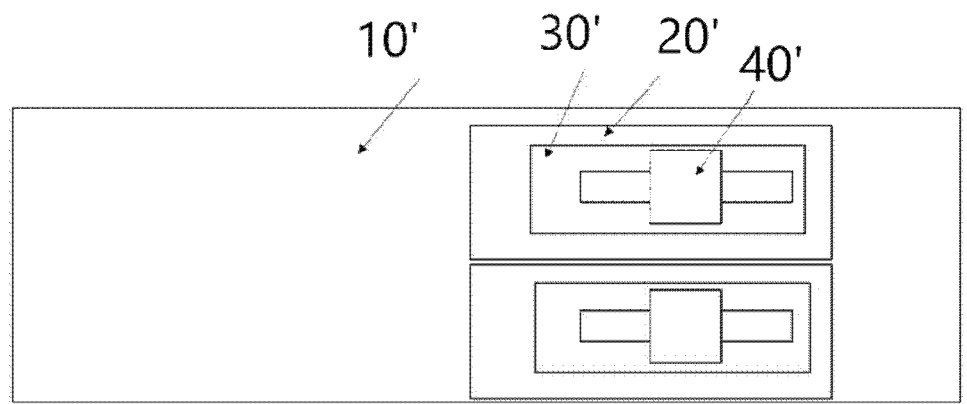
FIG. 6 shows a top view of a conventional circuit board assembly having daughterboards mounted on one motherboard.

In order to enhance the mechanical connection strength between the first circuit board 10 and the substrate 30, the end surface 12 of the first circuit board and the second contact surface 32 of the substrate can be shaped into structured surfaces (namely, surfaces with connection reinforcing structures). As shown in FIG. 4, the end surface 12 of the first circuit board is provided with a pulse-shaped concave-convex structure. As a variant, the end surface 12 of the first circuit board can be designed to have a wavy concave-convex structure, as shown in FIG. 5. The second contact surface 32 can be shaped correspondingly to have a structure complementary to that on the end surface 12. With these structured surfaces, the connection area and thus the amount of solder or adhesive applied thereon, can be greatly increased, therefore enhancing the mechanical connection strength therebetween.

The above connection reinforcing structure for enhancing the mechanical connection strength between the end surface 12 of the first circuit board and the second contact surface 32 can also be applied to the mechanical connection between the lower side of the first circuit board 10 and the second contact surface 32 of the substrate shown in the first embodiment. Of course, it can also be used for reinforcing the mechanical connection between the first contact surface 31 of the substrate 30 and the second circuit board 20. The connection reinforcing structure can be embodied in other regular or irregular shapes, although it is shown to be pulse-shaped or wavy-like.

Figure 2:
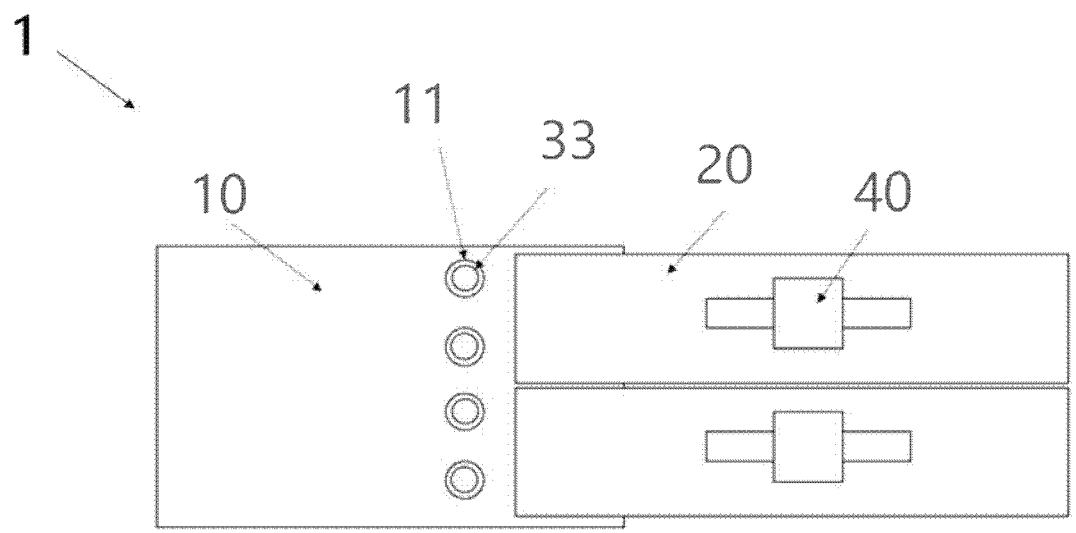
FIG. 2 shows the top view of a circuit board assembly according to the first embodiment of the present disclosure.

In all the above embodiments, the first circuit board can be a motherboard, and the second circuit board can be a daughterboard. As shown in FIG. 2, a plurality of daughterboards can be integrated onto the motherboard in the manner as shown in FIG. 1. According to the present disclosure, the daughterboards can be simply and firmly mounted on the motherboard without occupying too much space on the upper side of the motherboard.

Compared with the existing configuration in which all the daughterboards are mounted with their bottoms resting entirely against the upper side of the motherboard, the present disclosure can maximize the utilization of the motherboard, reduce the motherboard into a size as small as necessary and thus lower the cost in connection with the manufacturing of the motherboard. In addition, according to the configuration of the present disclosure, the daughterboard can be mounted as a modular device, the reusability of the motherboard and the daughterboard can be improved, with the development cost therefor being saved or lowered.

Furthermore, in view that the mechanical connection between the substrate and the motherboard/the daughterboard, the electrical connection between the motherboard and the daughterboard, the electrical connection between the power component and the daughterboard, and the mechanical connection between the power component and the substrate can be realized by a soldering joint, the whole circuit board assembly can be produced by means of a standard surface mount welding process in one step with high assembling efficiency.

Although it is shown in FIG. 2 that there are two positioning protrusions for each daughterboard, the skilled in the art could readily appreciate that each daughterboard can be designed to have one or more than two positioning protrusions.

Although in the embodiments shown in FIGS. 1-3, the second circuit board is mounted onto the first circuit board with an overlap therebetween, it can also be appreciated by those skilled in the art that the first circuit board and the second circuit board may be placed without any overlap therebetween, due to the fact that the second circuit board is always supported and well positioned by the substrate with respect to the first circuit board. For example, the second circuit board can be coplanar with the first circuit board and located at a certain distance away from the first circuit board. In this configuration, the electrical connection between the second circuit board and the first circuit board can be realized through jumpers.

In this text, terms "upper", "above" and "lower", "below" refer to the side facing up and the side facing down respectively when the circuit board concerned is placed horizontally.

Although in the illustrated embodiments the second circuit board overlaps the first circuit board from its above, it can be easily understood that the second circuit board can also be placed with an overlap on the lower side of the first circuit board. The relative positional relationship between the first and second circuit boards can be adjusted to accommodate the specific mounting requirements.

In addition, within the scope of the present disclosure, the second circuit board can also be placed in a non-parallel or non-coplanar position with respect to the first circuit board, as long as the projection of the second circuit board on an imaginary horizontal plane extends further than or beyond the projection of the first circuit board on the same imaginary horizontal plane. In this case, the substrate may be formed in a suitable shape having an extension portion extending in a direction from the boundary line of the projection of the first circuit board to the boundary line of the projection of the second circuit board that is located further on the imaginary horizontal plane, thereby making it possible to offer a supporting surface (i.e. the first contact surface) for the second circuit board, and securing the mechanical connection strength between the two circuit boards and therefore the electrical connection strength between the two circuit boards, and at the same time allowing dissipating heat from the power component and the heat generated at the electrical connection area between the first circuit board and the second circuit board.

Therefore, according the present disclosure, it is the substrate (rather than the first circuit board) that plays a main role of supporting the second circuit board. Taking in this sense, the substrate can be regarded as an extension of the first circuit board that extends in the direction of a region located adjacent to the main portion of the second circuit board that may be "suspended" if no direct support comes from the first circuit board or the substrate. That is to say, a portion of the expensive first circuit board that is supposed to provide support for the second circuit board (especially the "suspended" portion of the second circuit board) is now replaced by the substrate which is made of a low-cost material and is easy to shape without sacrificing any mechanical connection strength between the two circuit boards. Additionally, since the substrate is made of a material with higher thermal conductivity than those for a circuit board (especially, a multi-layered motherboard), the heat dissipation performance of the whole circuit board assembly is greatly improved.

As explained in the above, the phase "as an extension of the first circuit board" refers to the main body of the substrate extending from the first circuit board in the direction of a region that is close to the second circuit board and allows offering a contact surface for supporting the second circuit board. On the assumption that the first circuit board is placed horizontally (and in most cases, the first circuit board is in a horizontal position), the extension direction involved is oriented horizontally, in view that it is mainly aimed to cover part or full of the distance between the boundary lines of the projections of the first and second circuit board on an imaginary horizontal plane.

The circuit board assembly according to the present disclosure is applicable to a radio unit, for example, classic radio or big power radio product. With the circuit board assembly of the present disclosure, the radio unit could have a potential of being expanded with higher integration degree, and by means of the provision of substrate therein, the heat dissipation condition in the radio product can be improved as well.

References in the present disclosure to "an embodiment", "another embodiment" and so on, indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

It should be understood that, the term "and/or" includes any and all combinations of one or more of the associated listed terms.

The terminology used herein is for the purpose of describing particular embodiments only and is not intended to limit the present disclosure. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components, but do not preclude the presence or addition of one or more other features, elements, components and/or combinations thereof. The terms "connect", "connects", "connecting" and/or "connected" used herein cover the direct and/or indirect connection between two elements.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-Limiting and exemplary embodiments of this disclosure.

What is claimed is:

1. A circuit board assembly comprising:
   a first circuit board and a second circuit board, which are electrically connected with each other; and
   a monolithic substrate configured to support a power component and comprising:
      a first contact surface that is fixedly connected to and forms a thermal contact with the second circuit board, and
      a second contact surface that is fixedly connected to the first circuit board and forms a thermal contact with the first circuit board so that the monolithic substrate functions as an extension of the first circuit board to support the second circuit board.

2. The circuit board assembly according to claim 1, wherein the first circuit board is a mother circuit board, and the second circuit board is a daughter circuit board.

3. The circuit board assembly according to claim 1, wherein the first circuit board and the second circuit board are arranged substantially in parallel and to partially overlap with each other.

4. The circuit board assembly according to claim 3, wherein the second circuit board extends above the first circuit board.

5. The circuit board assembly according to claim 4, wherein the first contact surface of the monolithic substrate is fixedly connected to a lower side of the second circuit board.

6. The circuit board assembly according to claim 5, wherein an area of the second circuit board that is in surface connection with the first contact surface is larger than an overlapping area between the first circuit board and the second circuit board.

7. The circuit board assembly according to claim 5, wherein the second contact surface of the monolithic substrate is fixedly connected to a lower side of the first circuit board.

8. The circuit board assembly according to claim 7, wherein:
   the second contact surface of the monolithic substrate comprises a connection reinforcing structure;
   the first circuit board includes a structure that is complementary to the connection reinforcing structure of the second contact surface; and
   the connection reinforcing structure and the complementary structured are arranged to reinforce the connection between the monolithic substrate and the first circuit board.

9. The circuit board assembly according to claim 7, wherein the second contact surface of the monolithic substrate is fixedly connected to the first circuit board in a region close to an overlapping area between the first circuit board and the second circuit board.

10. The circuit board assembly according to claim 5, wherein the second contact surface of the monolithic substrate is fixedly connected to an end surface of the first circuit board.

11. The circuit board assembly according to claim 5, further comprising a power component that is mounted on the second circuit board, is electrically connected to an upper side of the second circuit board, extends through an opening provided in the second circuit board, and is fixedly connected to the monolithic substrate by soldering.

12. The circuit board assembly according to claim 1, wherein:
   the monolithic substrate comprises at least one protrusion from its second contact surface towards the first circuit board; and
   the at least one protrusion is arranged to position the monolithic substrate with respect to the first circuit board.

13. The circuit board assembly according to claim 12, wherein the first circuit board includes at least one through hole arranged to receive the at least one protrusion of the monolithic substrate.

14. The circuit board assembly according to claim 13, wherein an outer circumferential surface of the respective at least one protrusion and an inner wall of the respective at least one through hole are fixedly connected by soldering.

15. The circuit board assembly according to claim 1, wherein one or more of the following applies:
   the first contact surface of the monolithic substrate is fixedly connected to the second circuit board by soldering, and
   the second contact surface of the monolithic substrate is fixedly connected to the first circuit board by soldering.

16. The circuit board assembly according to claim 3, wherein the first circuit board and the second circuit board include signal pads in respective areas that overlap with each other, and wherein the first circuit board and the second circuit board are electrically connected with each other by soldering together the signal pads in the respective areas that overlap.

17. The circuit board assembly according to claim 1, wherein the first circuit board and the second circuit board are electrically connected via a connector.

18. A radio unit comprising the circuit board assembly according to claim 1.

* * * * *